(12) United States Patent
Langhammer et al.

(10) Patent No.: US 11,301,213 B2
(45) Date of Patent: Apr. 12, 2022

(54) REDUCED LATENCY MULTIPLIER CIRCUITRY FOR VERY LARGE NUMBERS

(71) Applicant: Intel Corporation, Santa Clara, CA (US)

(72) Inventors: Martin Langhammer, Alderbury (GB); Bogdan Pasca, Toulouse (FR)

(73) Assignee: Intel Corporation, Santa Clara, CA (US)

( * ) Notice: Subject to any disclaimer, the term of this patent is extended or adjusted under 35 U.S.C. 154(b) by 211 days.

(21) Appl. No.: 16/450,555

(22) Filed: Jun. 24, 2019

(65) Prior Publication Data
US 2019/0310828 A1 Oct. 10, 2019

(51) Int. Cl.
G06F 7/544 (2006.01)
H03K 19/177 (2020.01)

(52) U.S. Cl.
CPC .......... G06F 7/5443 (2013.01); H03K 19/177 (2013.01)

(58) Field of Classification Search
CPC ..................................................... G06F 7/5443
See application file for complete search history.

(56) References Cited

U.S. PATENT DOCUMENTS

| | | | |
|---|---|---|---|
| 4,549,280 A | 10/1985 | Schomburg | |
| 4,958,312 A | 9/1990 | Ang et al. | |
| 5,047,974 A | 9/1991 | Young | |
| 5,726,927 A | 3/1998 | Wolrich et al. | |
| 5,784,305 A | 7/1998 | Nadehara | |
| 6,529,931 B1 | 3/2003 | Besz et al. | |
| 6,539,413 B1* | 3/2003 | Goldovsky | G06F 7/506 708/700 |
| 7,152,089 B2* | 12/2006 | Harris | G06F 7/508 708/710 |
| 7,509,368 B2 | 3/2009 | Anders et al. | |
| 2004/0034678 A1* | 2/2004 | Kuszmaul | G06F 9/3869 708/446 |
| 2004/0128339 A1* | 7/2004 | Kalampoukas | G06F 7/727 708/706 |
| 2006/0253523 A1* | 11/2006 | Anders | G06F 7/507 708/706 |

(Continued)

OTHER PUBLICATIONS

Martin Langhammer et al., U.S. Appl. No. 16/052,336, filed Aug. 1, 2018.

(Continued)

*Primary Examiner* — Michael D. Yaary
(74) *Attorney, Agent, or Firm* — Fletcher Yoder, P.C.

(57) ABSTRACT

An integrated circuit with a large multiplier is provided. The multiplier may be configured to receive large input operands with thousands of bits. The multiplier may be implemented using a multiplier decomposition scheme that is recursively flattened into multiple decomposition levels to expose a tree of adders. The adders may be collapsed into a merged pipelined structure, where partial sums are forwarded from one level to the next while bypassing intervening prefix networks. The final correct sum is not calculated until later. In accordance with the decomposition technique, the partial sums are successively halved, which allows the prefix networks to be smaller from one level to the next. This allows all sums to be calculated at approximately the same pipeline depth, which significantly reduces latency with no or limited pipeline balancing.

22 Claims, 11 Drawing Sheets

(56) References Cited

U.S. PATENT DOCUMENTS

2016/0378715 A1* 12/2016 Kang .................... G06F 9/3877
                                                             712/2
2019/0114140 A1    4/2019 Langhammer

OTHER PUBLICATIONS

Martin Langhammer et al., U.S. Appl. No. 16/147,098, filed Sep. 28, 2018.

* cited by examiner $$A * B = (2^K * AH + AL) * (2^K * BH + BL)$$

$$= 2^{2K}(AH * BH) + 2^K \underbrace{(AH * BL + AL * BH)}_{X} + (AL * BL)$$

FIG. 3A $$(AH + AL) * (BH + BL) = (AH * BH) + \underbrace{(AH * BL + AL * BH)}_{X} + (AL * BL)$$

$$X = \underbrace{(AH + AL) * (BH + BL)}_{PM} - \underbrace{(AH * BH)}_{PH} - \underbrace{(AL * BL)}_{PL}$$

FIG. 3B

REDUCED LATENCY MULTIPLIER CIRCUITRY FOR VERY LARGE NUMBERS

BACKGROUND

This relates generally to integrated circuits, such as field-programmable gate arrays (FPGAs). More particularly, the present disclosure relates to adder circuitry configured to perform large arithmetic operations on an FPGA.

Integrated circuits increasingly carry out custom functions such as encryption that have become essential to everyday life. Indeed, encryption is becoming increasingly valuable in a number of technical fields such as financial transaction security and many other applications. Encryption (as well as many other operations that can take place on an integrated circuit such as certain multiplication operations) may use increasingly large precision arithmetic that, in some cases, involve performing arithmetic operations to sum together operands having a large precision. In some cases, for example, the precision of the operands may be on the order of thousands of bits.

Conventionally, large multipliers implemented on an FPGA require very large adders. To implement large multiplications, decomposition algorithms such as the Karatsuba or Toom-Cook method of performing fast multiplications are often used. These decomposition methodologies, however, create many large adders connected in series, which result in long latency paths, high logic resource count, and demanding routing requirements. It is within this context that the embodiments described herein arise.

BRIEF DESCRIPTION OF THE DRAWINGS

FIGS. 3A and 3B are diagrams illustrating the Karatsuba decomposition.

DETAILED DESCRIPTION

The present embodiments relate to an integrated circuit implementing a multiplier decomposition method that is recursively flattened to expose a series of adders at different levels of the decomposition. The adders may be collapsed or merged into a single pipelined structure where partial sums are forwarded to successive levels before the correct sum is computed at each level (or stage). The final sum is not computed until the final stage. The partial summing operations may be successively halved at each level, and the prefix networks are smaller from one level to the next. Thus, the pipelining can also be reduced at every level.

Configured in this way, all partial sums can be computed at roughly the same pipeline depth. As the result, all input bits may be supplied to the flattened multiplier at the same time without requiring much or any pipeline balancing. Large multiplier circuitry implemented in this way on a programmable integrated circuit will use much less logic and routing resources while minimizing latency, allowing it to compete with their application-specific integrated circuit (ASIC) counterparts.

It will be recognized by one skilled in the art, that the present exemplary embodiments may be practiced without some or all of these specific details. In other instances, well-known operations have not been described in detail in order not to unnecessarily obscure the present embodiments.

Figure 1:
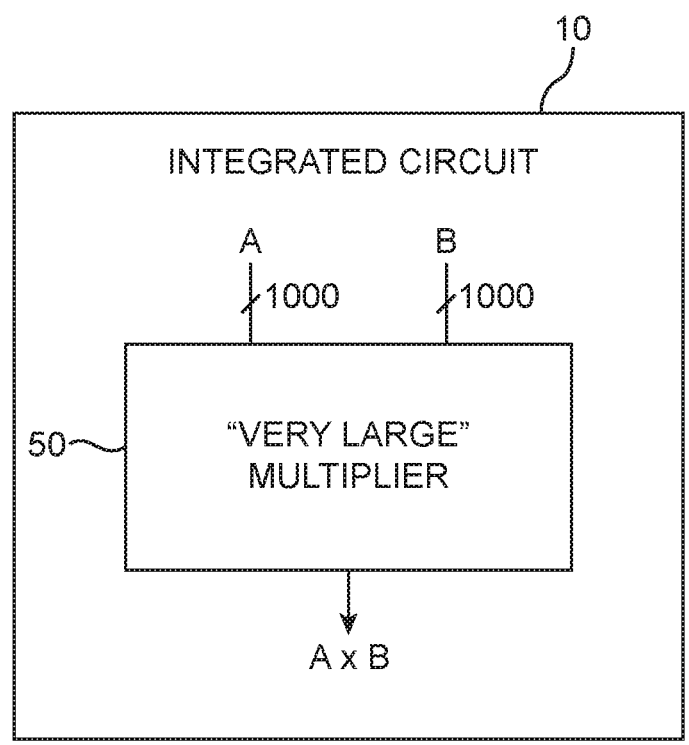
FIG. 1 is a diagram of an illustrative integrated circuit that includes multiplier circuitry in accordance with an embodiment.

With the foregoing in mind, FIG. 1 is a diagram of an integrated circuit 10 configured to implement arithmetic operations. A designer may want to implement functionality such as large precision arithmetic operations on integrated circuit device 10 (e.g., a field-programmable gate array (FPGA) or an application-specific integrated circuit (ASIC)). As shown in FIG. 1, integrated circuit 10 may include "very large" multiplier circuitry such as multiplier 50. In the example of FIG. 1, multiplier 50 may be referred to as a very large multiplier because it is configured to compute the product of two inputs A and B, each having 1000 bits.

In general, very large multiplier 50 may be used to combine inputs with more than 50 bits, at least 100 bits, hundreds of bits, 100-1000 bits, at least 1000 bits, thousands of bits, tens of thousands of bits, hundreds of thousands of bits, or even millions of bits. Multiplier network 50 might also be used to multiply more than two very large numbers (e.g., multiplier 50 can be used to combine more than two large integers, four or more large integers, eight or more large integers, sixteen or more large integers, etc.).

Figure 2:
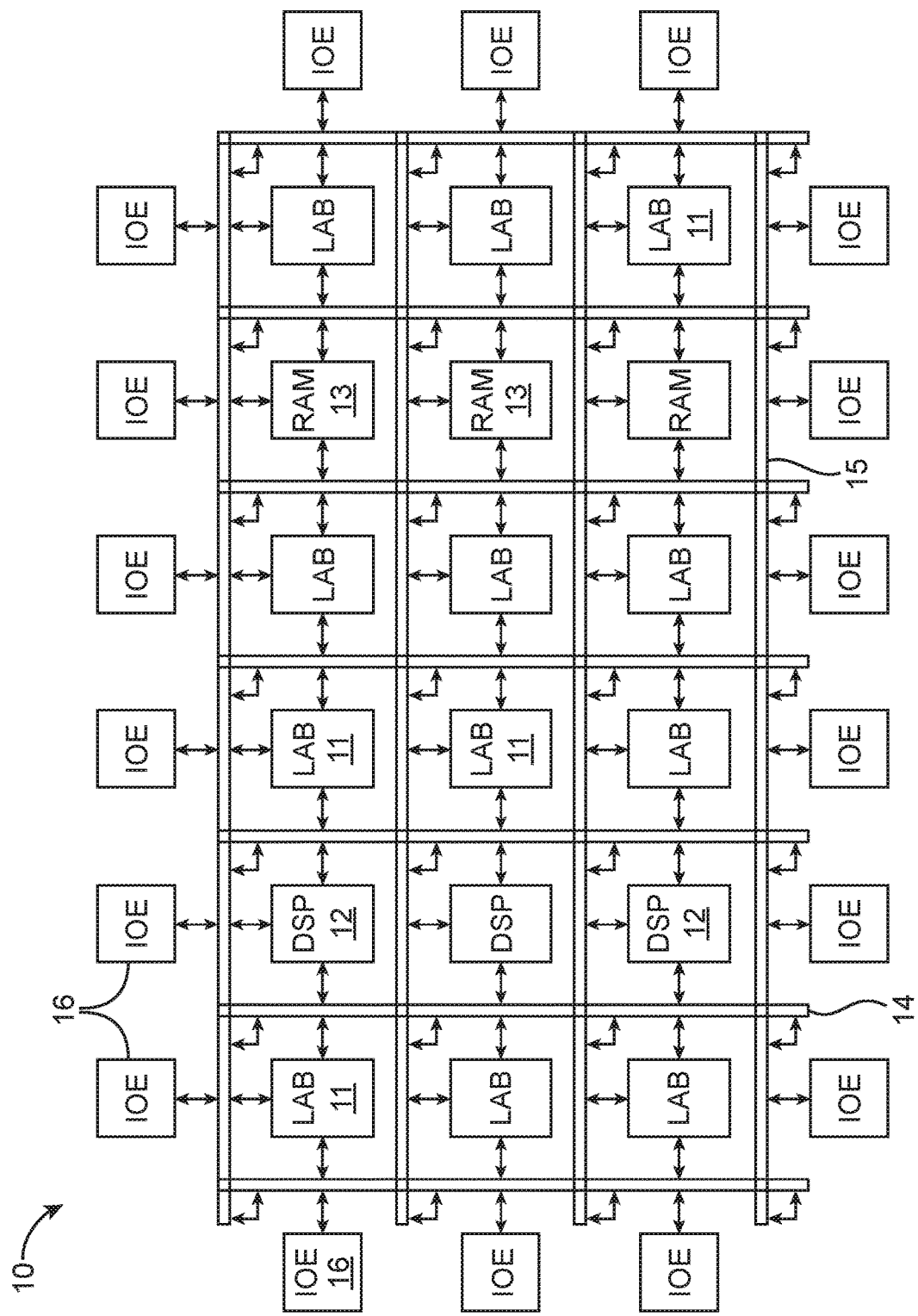
FIG. 2 is a diagram of an illustrative programmable integrated circuit in accordance with an embodiment.

Integrated circuit 10 might be implemented as a programmable integrated circuit device such as programmable logic device 10 of FIG. 2, where large precision arithmetic has traditionally been challenging. As shown in FIG. 2, programmable logic device 10 may include a two-dimensional array of functional blocks, including logic array blocks (LABs) 11 and other functional blocks, such as random access memory (RAM) blocks 13 and specialized processing blocks such as digital signal processing (DSP) blocks 12 that are partly or fully hardwired to perform one or more specific tasks such as mathematical; arithmetic operations.

Functional blocks such as LABs 110 may include smaller programmable regions (e.g., logic elements, configurable logic blocks, or adaptive logic modules) that receive input signals and perform custom functions on the input signals to produce output signals. Device 10 may further include programmable routing fabric that is used to interconnect LABs 11 RAM blocks 13 and DSP blocks 12. The combination of the programmable logic and routing fabric is sometimes referred to as "soft" logic, whereas the DSP blocks are sometimes referred to as "hard" logic. The ype of hard logic on device 10 is not limited to DSP blocks and may include other types of hard logic.

Programmable logic device 10 may contain programmable memory elements for configuring the soft logic. Memory elements may be loaded with configuration data (also called programming data) using input/output elements (IOEs) 16. Once loaded, the memory elements provide corresponding static control signals that control the operation of one or more LABs 11, programmable routing fabric, and optionally DSPs 12 or RAMs 13. In a typical scenario, the outputs of the loaded memory elements are applied to the gates of metal-oxide-semiconductor transistors (e.g., pass transistors) to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, mechanical memory devices (e.g., including localized mechanical resonators), mechanically operated RAM (MORAM), programmable metallization cells (PMCs), conductive-bridging RAM (CBRAM), resistive memory elements, combinations of these structures, etc. Because the memory elements are loaded with configuration data during programming, the memory elements are sometimes referred to as configuration memory, configuration RAM (CRAM), configuration memory elements, or programmable memory elements.

In addition, programmable logic device 10 may use input/output elements (IOEs) 16 to drive signals off of device 10 and to receive signals from other devices. Input/output elements 16 may include parallel input/output circuitry, serial data transceiver circuitry, differential receiver and transmitter circuitry, or other circuitry used to connect one integrated circuit to another integrated circuit. As shown, input/output elements 16 may be located around the periphery of the chip. If desired, the programmable logic device may have input/output elements 16 arranged in different ways.

The routing fabric (sometimes referred to as programmable interconnect circuitry) on PLD 10 may be provided in the form of vertical routing channels 14 (i.e., interconnects formed along a vertical axis of PLD 100) and horizontal routing channels 15 (i.e., interconnects formed along a horizontal axis of PLD 10), each routing channel including at least one track to route at least one wire. If desired, routing wires may be shorter than the entire length of the routing channel. A length L wire may span L functional blocks. For example, a length four wire may span four functional blocks. Length four wires in a horizontal routing channel may be referred to as "H4" wires, whereas length four wires in a vertical routing channel may be referred to as "V4" wires.

Furthermore, it should be understood that embodiments may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns. Configurations in which very large multiplier circuitry 50 is formed within a programmable device 10 such as a field-programmable gate array (FPGA) die will be described herein as an example but is not intended to limit the scope of the present embodiments. If desired, multiplier circuitry 50 be formed as part other an ASIC, central processing unit (CPU), graphics processing unit (GPU), application-specific standard product (ASSP), microprocessor, microcontroller, or other suitable types of integrated circuits.

As shown in FIG. 1, FPGA 10 may include one or more large multipliers 50, which are increasingly needed for public key encryption techniques such as the Rivest-Shamir-Adleman (RSA) cryptography algorithm. A popular method for performing fast multiplication is the Karatsuba recurrence decomposition method. Although examples herein will sometimes refer to the classical Karatsuba methodology, the embodiments herein will generally apply to other suitable variations such as the Toom-Cook multiplier algorithm or the Schönhage-Strassen multiplier algorithm, just to name a few.

FIGS. 3A and 3B are diagrams illustrating the Karatsuba decomposition for multiplying A by B, where A and B are each 2k (i.e., 2000) bit input operands. Input A is divided into an upper k-bit half portion AH and a lower k-bit half portion AL. Similarly, input B is divided into an upper k-bit half portion BH and a lower k-bit half portion BL. Thus, A can be represented as ($2^k$*AH+AL), whereas B can be represented as ($2^k$*BH+BL). As a result, A*B will expand out to be equal to [$2^{(2k)}$*(AH*BH)+$2^k$*(AH*BL+AL*BH)+(AL*BL)], where the middle term (AH*BL+AL*BH) will be labeled as "X".

A key observation of Karatsuba is that the middle X term can be generated by multiplying the sum of the upper and lower halves for each input operand (see, e.g., FIG. 3B). Sum (AH+AL) may be referred to as the upper and lower halves sum for input A, whereas sum (BH+BL) may be referred to as the upper and lower halves sum for input B. As shown in FIG. 3B, (AH+AL)*(BH+BL) is equal to [(AH*BH)+X+(AL*BL)]. Isolating X to one side of the equation, X is equal to [(AH+AL)*(BH+BL)−(AH*BH)−(AL*BL)]. The product of the upper halves AH*BH may be referred to as high product PH; the product of the lower halves AL*BL may be referred to as low product PL; and the product of the halves sums (AH+AL)*(BH+BL) may be referred to as middle product PM.

Normally, the expression of FIG. 3A would require four k*k multipliers and one 3k bit adder. However, by substituting the expression of X from FIG. 3B into the expression of FIG. 3A, only three multipliers (two of size k*k and one of size (k+1)*(k+1)) are needed since PH and PL that are needed to compute X are also needed in the original expression in FIG. 3A and can therefore be reused. Thus, the Karatsuba methodology can help reduce the number of multipliers that are needed to compute the desired product.

Figure 4:
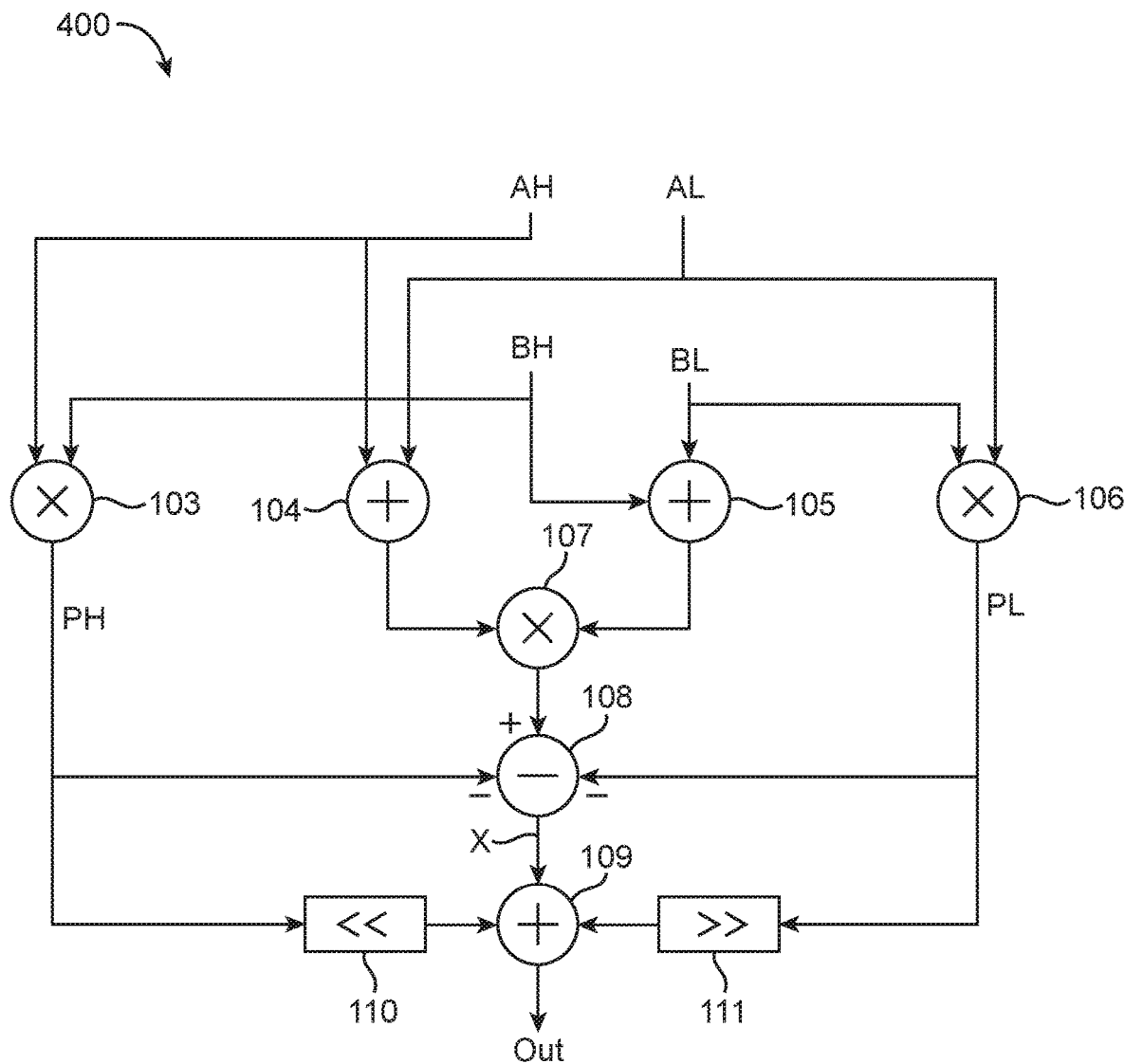
FIG. 4 is a block diagram of illustrative multiplier circuitry implementing the Karatsuba decomposition process in accordance with an embodiment.

FIG. 4 is a block diagram of illustrative multiplier circuitry 400 implementing the Karatsuba decomposition process. Inputs A and B are each split into upper halves AH and BH and lower halves AL and BL, respectively. The two upper halves AH and BH are multiplied using multiplier circuit 103 to generate product PH, whereas the two lower halves AL and BL are multiplied using multiplier circuit 106 to generate product PL. The upper and lower halves of A (i.e., AH and AL) are summed by adder circuit 104, whereas the upper and lower halves of B (i.e., BH and BL) are summed by adder circuit 105. Multiplier circuit 107 may then compute the product of the sum from adder 104 and the sum from adder 105 to generate product PM. The results of multipliers 103 and 106 are then subtracted from the output PM of multiplier 107 using subtraction circuit 108 to generate X (see FIG. 3B).

The outputs of multipliers 103 and 106 may be shifted to the appropriate bit position (e.g., using shifting circuits 110 and 111) and combined at adder circuit 109. Circuit 109 may then add value X to this combined value. The order of the post multiplier additions at circuits 108 and 109 is not important, which allows the designer to combine the larger numbers in a high order decomposition scheme in a way that is optimized for hardware implementation.

Figure 5:
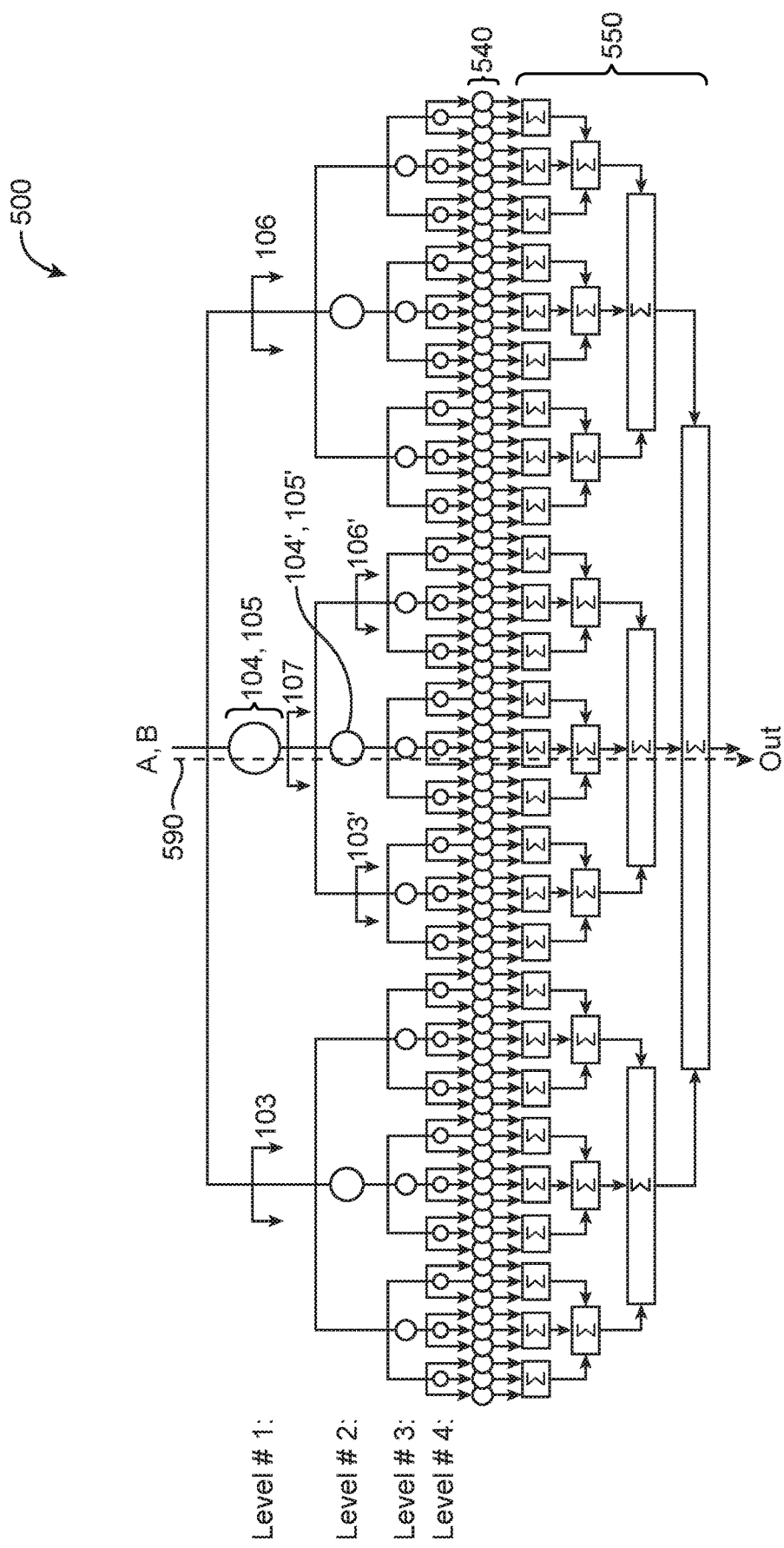
FIG. 5 is a diagram of illustrative multiplier circuitry decomposed into four levels in accordance with an embodiment.

The Karatsuba multiplication scheme can be recursively decomposed. In other words, each of multipliers 103, 106, and 107 may itself be implemented using the entire structure of multiplier 400, and the process iterated for each level of decomposition that is desired. FIG. 5 is a diagram of illustrative multiplier circuitry 500 with a flat (unrolled) decomposition of four levels. As shown in FIG. 5, the first level of decomposition splits the inputs into three logical multiplier paths. The left multiplier path leads to multiplier 103 (see, e.g., FIG. 4); the right multiplier path leads to multiplier 106; and the middle multiplier path leads to multiplier 107 via adders 104 and 105. Assuming inputs A and B are each 2048 bits wide, the adders at the first level (or the first decomposition stage) can be 1024-bit adders (with carry out) since adders 104 and 105 only need to sum together half portions of each input.

Multipliers 103, 106, and 107 can each be further recursively decomposed into three new branches at each level of the decomposition. At the second level of decomposition, there may be 9 total multiplier paths; adders 104' and 105' corresponding to multiplier 103 and 106 can be 512-bit adders (with carry out) since the inputs are halved at each successive level. Adders 104' and 105' corresponding to multiplier 107 will be 513 bits wide (with carry out), since the inputs to multiplier 107 are 1025-bits wide, and the decomposition splits this into a lower 512-bit chunk, and an upper 513-bit chunk. Continuing to the third level of decomposition, there may be 27 total multiplier paths. For the sake of simplicity we state that adders 104"/105" at this level can be 256-bit, 257-bit or 258-bit wide. At the fourth decomposition stage, there may be 81 total multiplier paths, and each adder 104'''/105''' at that stage can be 128-bit, 129-bit, 130-bit or 131-bit wide adders. All adders 104'/105' in this example produce a carry-out. The exact bit-width of an adder 104'/105' from circuit 500 may be computed from the input width of the operands A and B (2048 in our example) divided by 2^(level)+alpha, where alpha may represent the total number of adders that are found upstream of the concerned adder. For example, adders 104'/105' found on path 590 preceding multipliers 540 will have a size: (2048/2^4)+3 bit=131-bit adder (with carry out). This example where multiplier circuitry 500 is decomposed into four levels is merely illustrative. If desired, more or fewer levels of decomposition stages may be implemented, where the final stage operates on chunks that may be multiplied efficiently; this could correspond to the native multiplier size of device 10, but can also correspond to widths for which other efficient handcrafted implementations may exist. Moreover, the smaller adders (e.g., 64-bit adders or smaller) may be implemented using carry select or ripple carry adders to reduce routing complexity and improve latency.

In the example of FIG. 5, multiplier circuitry 500 may include 81 multipliers 540 that compute separate products for each of the 81 total unrolled multiplier paths. Multipliers 540 may each be efficiently implemented using one or more DSP blocks (see, e.g., DSP block 12 in FIG. 2) within device 10. Building large multipliers in this way allows for large precision inputs while reducing the number of leaf multiplier circuits 540 required to implement the overall multiplication. The adders above multipliers 540 follow the successive recursive decomposition, whereas the circuitry 550 below multipliers 540 serves to perform adder reduction. Adder reductions can be efficiently implemented using a redundant form compression scheme (e.g., a 4:2 or 3:2 redundant form adder compression scheme or using generalized parallel counters) or using high precision adder trees described in detail in commonly-owned U.S. patent application Ser. No. 16/206,748, filed on Nov. 30, 2019, which is incorporated herein by reference.

In the example of FIG. 5, the number of adders in any multiplier path is anywhere from one to four adders deep, where the size of the adders is roughly halved at each level as shown by the circles of decreasing sizes. Since the adders are relatively large (e.g., operating on inputs with more than 16 bits, more than 32 bits, more than 64 bits, etc.), each individual adder may exhibit a relatively long latency. As a result, the multipliers 540 following the last decomposition stage may receive their inputs at different times. This unbalanced latency through the various branches of the decomposition tree is a circuit inefficiency that needs to be addressed.

Figure 6:
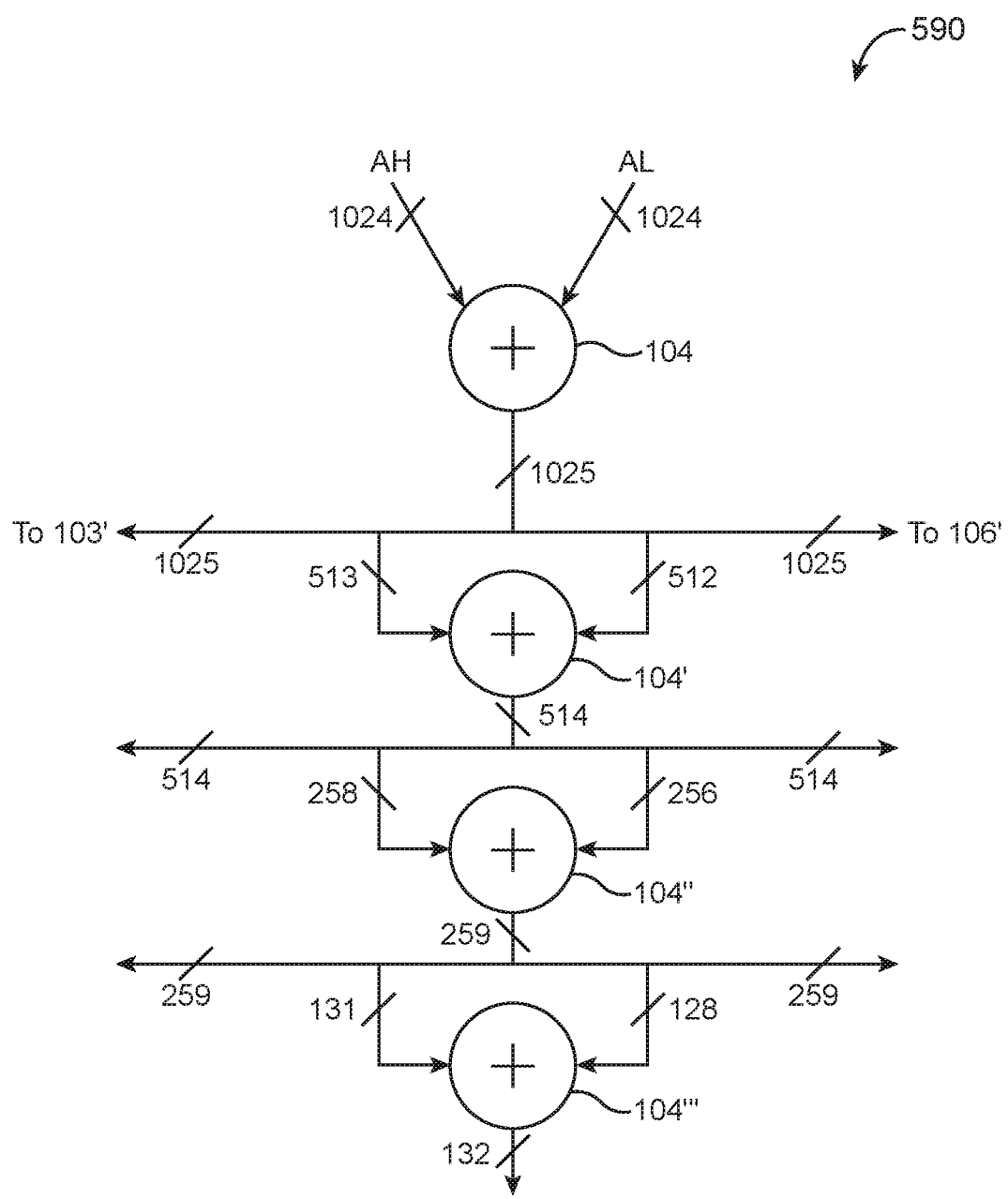
FIG. 6 is a diagram of an illustrative recursive adder stack extending through the four levels of decomposition in accordance with an embodiment.

Still referring to FIG. 5, multiplier path 590 down the middle has four adders connected in series. This four-level recursive adder stack is also illustrated in FIG. 6. As shown in FIG. 6, there may be adder 104 in the first stage, adder 104' in the second stage, adder 104" in the third stage, and adder 104''' in the fourth stage for computing the upper and lower halves sums for input A. There will also be another chain of adders 105 for calculating the upper and lower halves sums for input B. As described above, this chained adder stack may be further decomposed with more stages so that the adders at the bottom level are reduced down to 64, 32 or any other bit-width that results in an efficient implementation of multipliers 540.

By inspection, there is no obvious way to parallelize the adder chain shown in FIG. 6 since each adder node depends on the complete and final value of the previous adder node in the chain. Each successive adder in path 590 can have long latency periods (e.g., as high as 100 or more cycles), where the largest input adder stage 104 at the top exhibits the greatest latency impact to the overall multiplier.

Figure 7A:
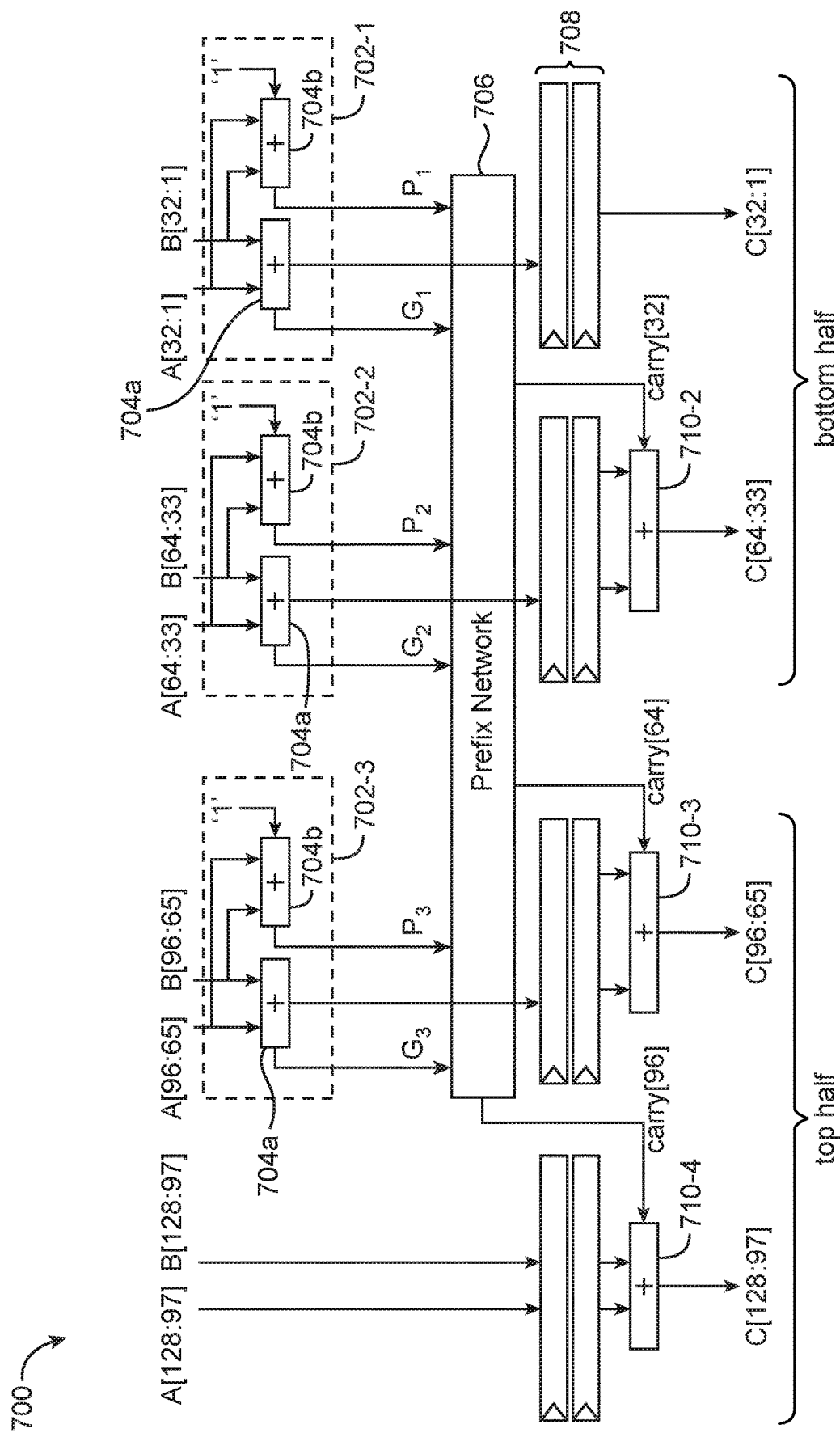
FIG. 7A is a diagram of a high-precision adder circuit that includes smaller segment adders configured to concurrently output generate and propagate signals.

One way for implementing a large adder stage such as the 128-bit adder 104''' in FIG. 6 is illustrated in FIG. 7A. FIG. 7A shows an efficient high-precision adder 700 suitable for handling the summation of large input operands by decomposing the operands into smaller segments. In the example of FIG. 7A, adder 700 receives two 128-bit operands A[128:1] and B[128:1], which are each separated into four 32-bit segments (e.g., A[32:1], A[64:33], A[96:65], and A[128:97] and B[32:1], B[64:33], B[96:65], and B[128:97], respectively).

Adder 700 may include a first segment decoder 702-1 configured to receive the first input segments (i.e., A[31:1] and B[32:1]), a second segment decoder 702-2 configured to receive the second input segments (i.e., A[64:33] and B[64:33]), and a third segment decoder 702-3 configured to receive the third input segments (i.e., A[96:65] and B[96:65]). Each segment decoder 702 may include a first segment adder 704a that sums the arriving input bits while receiving a carry-in bit of '0' and also a second segment adder 704b that sums the arriving input bits while receiving a carry-in bit of '1'.

Configured in this way, segment adder 704a provides a "generate" (G) signal at its carry output port while segment adder 704b provides a "propagate" (P) signal at its carry output port. For example, segment adder 704a in decoder 702-1 provides a first generate signal $G_1$ at its carry output; segment adder 704b in decoder 702-1 provides a first propagate signal $P_1$ at its carry output; segment adder 704a in decoder 702-2 provides a second generate signal $G_2$ at its carry output; segment adder 704b in decoder 702-2 provides a second propagate signal $P_2$ at its carry output; segment adder 704a in decoder 702-3 provides a third generate signal $G_3$ at its carry output; and segment adder 704b in decoder 702-3 provides a third propagate signal $P_3$ at its carry output. The generate and propagate signals output from segment decoders 702 may be received at a prefix network 706. Prefix network 706 may be implemented using a Kogge-Stone topology, a Brent-Kung topology, a Sklansky topology, a pipelined topology, and/or any other suitable topology. A prefix network may have a tree-like topology and may therefore sometimes be referred to as a prefix tree. In any case, prefix network 706 may receive the generate and propagate signals from decoders 706 as inputs and generate corresponding carry bits.

Adder 700 may further include final segment adders 710 for computing the final correct sum bits. Segment adder 704a of decoder 702-1 may have a sum output, which may be forwarded (potentially delayed using one or more registers 708) to the lower sum output bits C[32:1], where C=(A+B). Segment adder 704a of decoder 702-2 may have a sum output, which can be delayed using one or more registers 708 and then combined with carry bit carry[32] output from prefix network 706 using final segment adder 710-2 to obtain sum output bits C[64:33]. Meanwhile, segment adder 704a of decoder 702-3 has a sum output, which can be delayed using one or more registers 708 and then combined with carry bit carry[64] output from prefix network 706 using final segment adder 710-3 to obtain sum output bits C[96:65]. Lastly, inputs A[128:97] and B[128:97] from the upper segment may be delayed using one or more registers 708 and combined at final segment adder 710-4 with carry bit carry[96] output from prefix network 706 to obtain sum output bits C[128:97]. Although only a 128-bit adder 700 is illustrated in FIG. 7A, this exemplary adder structure may be scaled up to support thousands of bits with minimal increase in latency (e.g., by introducing more segments and/or wider segments). This adder structure may also use other techniques, or a combination of techniques for obtaining the final sum bits. These include, and are not limited to: multiplexing circuitry between sums produced by 704a and 704b, subtraction of the carry from 704b etc.

Figure 7B:
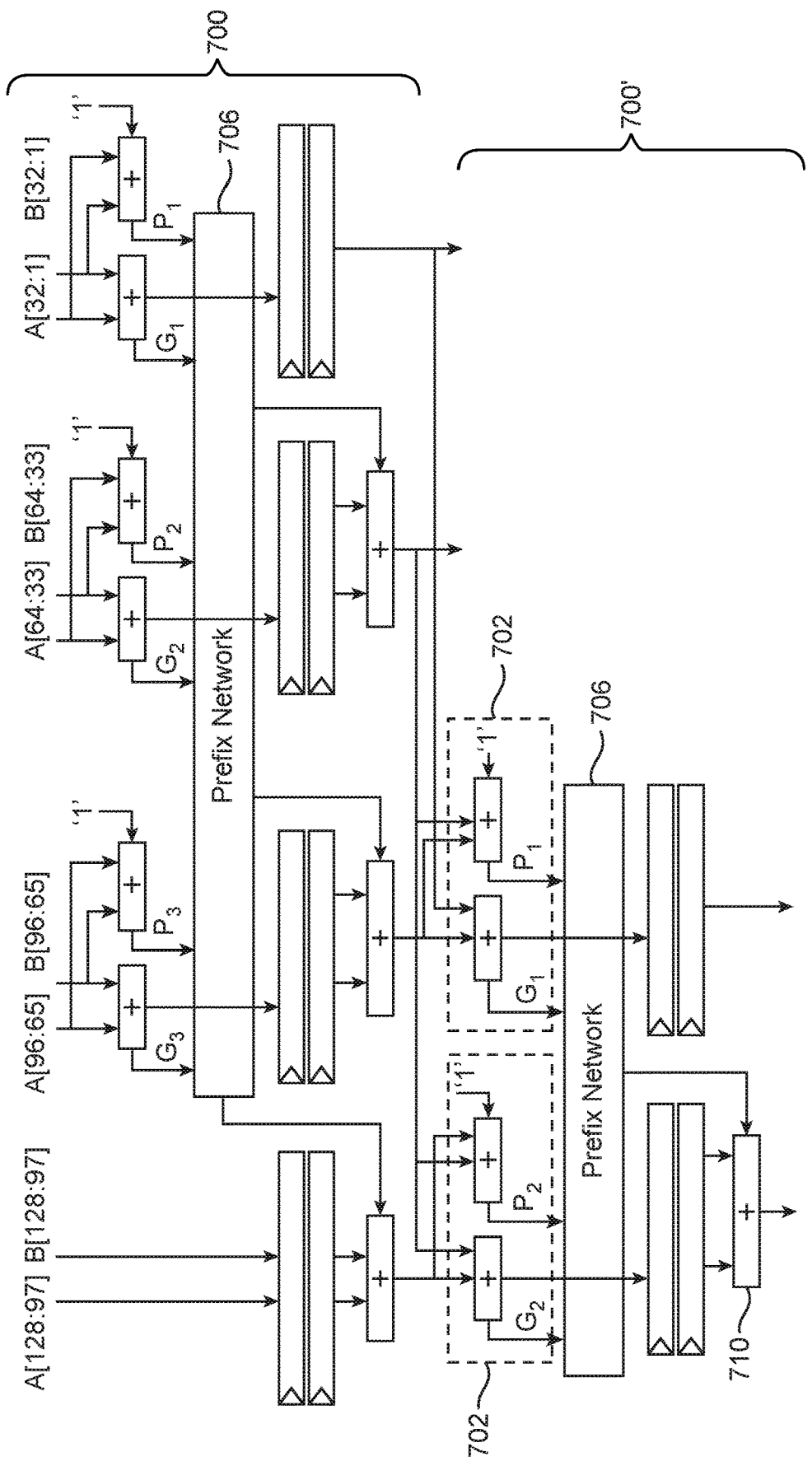
FIG. 7B is a diagram of multiple high-precision adder circuits of the type shown in FIG. 7A connected in a chain to implement the Karatsuba decomposition.

FIG. 7B illustrates an arrangement that uses the adder structure of FIG. 7A to implement the Karatsuba decomposition. As shown in FIG. 7B, adder 700 may represent a 128-bit segmented adder in a first decomposition stage that is chained with adder 700', which represents a 65-bit segmented adder in a second decomposition stage. By keeping the segment size consistent at 32 bits, a fewer number of segments is needed at the second stage (e.g., only two segment decoders 702 are needed in adder 700' to add together the upper half result and the lower half result from the previous stage). The problem with this type of vertically stacked adder structure of FIG. 7B is that the second adder stage will need to wait for the complete and final result from the previous stage before it can start computing its current sum. As a result, the latencies of each adder stage will add up without any parallelism, which results in an unacceptably prolonged latency period for large multipliers when the number of decomposition stages is increased.

Figure 8:
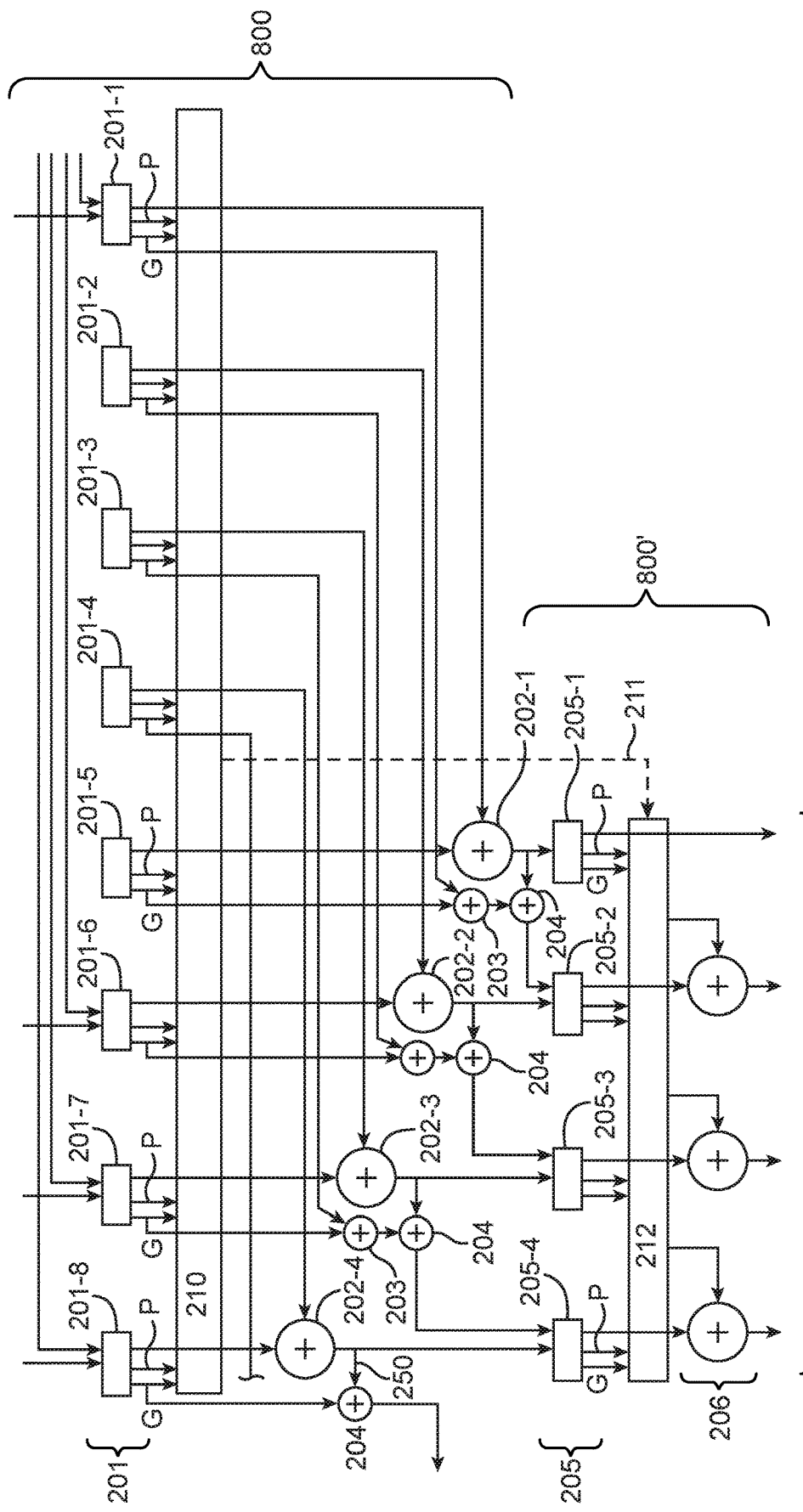
FIG. 8 is a diagram of illustrative multiplier circuitry having a merged adder structure where adders at different levels can be pipelined to help reduce latency in accordance with an embodiment.

In accordance with an embodiment, adder circuitry such as adder 800 of FIG. 8 is provided that exhibits a merged adder structure where the segment adders at a given decomposition level does not depend on the output of the prefix network in that level. In other words, a subsequent adder stage will no longer need to wait for the complete and final result from the previous adder stage, which can help substantially reduce the latency of the adder chain.

FIG. 8 illustrates an example of a 256-bit adder 800, assuming each input segment decoder 201 is 32 bits wide. As shown in FIG. 8, adder 800 may include eight input segment decoders 201 (e.g., decoders 201-1, 201-2, 201-3, 201-4, 201-5, 201-6, 201-7, and 201-8). Each segment decoder 201 has the same dual segment adder structure as shown in the example of FIGS. 7A and 7B and thus can output corresponding generate (G) and propagate signals (P). The generate and propagate signals generated from each input segment decoder 201 is received by prefix network 210. Note that adder 800 may further include final segment adders (see, e.g., adders 710 in FIG. 7A) coupled at the output of prefix network 210 to compute the correct sum bits for that stage. These final segment adders are actually preset within adder 800 but are omitted from the illustration of FIG. 8 in order not to obscure the present embodiments.

Adder 800 may further include auxiliary segment adders 202 configured to add together the sums from the top and bottom halves output directly from decoders 201. Unlike the final segment adders 710 in FIG. 7A, auxiliary segment adders 202 do not require a carry input signal from the associated prefix network 210, thus allowing adders 202 to immediately begin computing their output right after decoder 201 is done (e.g., adder 704a within decoder 201 and auxiliary adder 202 may be effectively "merged" into an adder pipeline that does not need to wait for the correct sum to be output from final segment adders 710). In other words, the operation of auxiliary segment adders 202 bypasses the prefix network 210.

In the example of FIG. 8, auxiliary adder 202-1 may be configured to combine the lower half sum bits output directly from decoder 201-1 and the upper half sum bits output directly from decoder 201-5. The generate (G) bits associated with these segments are summed together using a corresponding 1-bit adder 203 (sometimes referred to as a generate bit adder). The sum output values of each adder 203 and carry output values of adder 202 may be summed together using another adder 204. The output of adder 204 therefore captures all of the overflows out of a segment accumulated to the current level. Adder 204 may therefore sometimes be referred to as a segment overflow adder. The remaining auxiliary segment adders 202-2 and 202-3 may also be provided with their own generate bit adder 203 and segment overflow adder 204. Finally, segment adder 202-4 is only provided with the segment overflow adder 204 that sums the generate bit (G) out of 201-8 with the carry-out of 202-4.

For recovering the correct sum at the bottom level, the accumulated sum of the overflows output by adder 204 at any point may then be added to the next segment of that same level (e.g., the output of adder 204 associated with auxiliary adder 202-1 may be combined with the sum output of adder 202-2 using segment decoder 205-2). Each segment decoder 205 exhibits the same dual segment adder structure as shown in the example of FIGS. 7A and 7B and thus can output corresponding generate (G) and propagate signals (P). The output of adder 204 associated with auxiliary adder 202-2 may be combined with the sum output of adder 202-3 using segment decoder 205-3. Similarly, the output of adder 204 associated with auxiliary adder 202-3 may be combined with the sum output of adder 202-4 using segment decoder 205-4. Segment decoder 205-1 may just receive the sum output from adder 202-1 without any additional carry overflow input.

The adder structure of the second decomposition level 800' is similar to the first level. Segment decoders 205 may each output G and P bits to prefix network 212 and may also output sum bits to final segment adders 206, which also receive carry bits from prefix adder 212. The reduction in number of segment adders from one stage to the next can be continued until there are only two segments remaining, or for as many steps required by the Karatsuba decomposition.

In order for the final segments adders 206 to compute the correct sums, any information generated by prefix network 210 has to be received and used in prefix network 212 to ensure that all potential carry signals between the middle two segments are accounted for (see, e.g., prefix carry signal path 211 in FIG. 8). Prefix network 212 may be half the size of prefix network 210 and may exhibit less logic depth than prefix network 210. For example, the (n/2+1) adder bit position will have a possible carry in from the n/2 adder bit position. There are various ways to compute this carry information between then successive prefix networks. In one suitable arrangement, the prefix computation can be extracted from the previous stage's prefix tree and input to the current stage's prefix tree, which is one segment longer to include the input to the first segment of the current stage. In the example of FIG. 8, there are at least two pipeline stages within the current stage (e.g., the carry and overflow adders 202, 203, and 204, followed by segment decoders 205), which gives the previous stage two pipelines in the prefix network 210 to produce the middle G/P pair.

In accordance with another suitable arrangement, all the generate/propagate pairs from the previous stage's segment adders can be forwarded to the current stage. In this scenario, the prefix tree 212 will be as wide as prefix tree 210. This may be tolerable since prefix trees are relatively small, often occupying only 5% or less of the total cost of a high precision adder. If desired, a combination of these techniques may be used to provide more flexibility in the distribution of pipelines through the adder design.

The example of FIG. 8 in which adder circuitry 800 is divided into eight 32-bit segments for decomposition is merely illustrative and is not intended to limit the scope of the present embodiments. In general, this merged pipelined adder structure of the type shown in FIG. 8 may be extended to adders of any bit width to help support multiplier decomposition schemes on input operands with hundreds or thousands of bits, where segments can be fewer than 32 bits, more than 32 bits, or any size.

Figure 9:
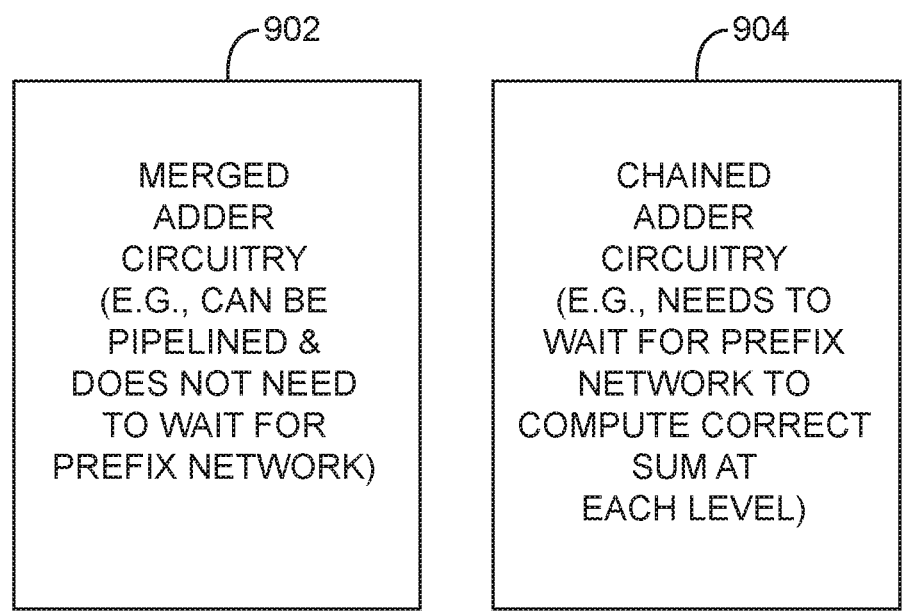
FIG. 9 is a diagram of illustrative multiplier circuitry that includes a merged adder data path and a separate chained adder data path in accordance with an embodiment.

FIG. 9 is a diagram of illustrative multiplier circuitry that includes a merged adder data path and a separate chained adder data path in accordance with an embodiment. The merged adder data path 902 includes the merged adder structure illustrated in FIG. 8, where input segment adders 201 have outputs that feed directly to auxiliary adders 202, generate bit adders 203, and overflow segment adders 204 without any dependence on the output of prefix tree 210. The corresponding segment decoders 205 that receive signals from auxiliary adders 202 and segment overflow adders 204 also do not rely on the output of the preceding prefix tree 210. In other words, merged adder circuitry 902 may be completely independent of the prefix tree networks. Conversely, the prefix networks are also substantially independent of the merged adder structure composed of the auxiliary and associated segment adders. This structural feature allows the adder path to be pipelined to substantially reduce its total latency.

The chained adder data path 904, which may include segment adders such as adders 710 of the type illustrated in FIG. 7A, are operative in parallel with the merged adder structure of FIG. 8 for use in calculating the correct sum bits. In contrast with merged adder structure 902, the chained adder structure 904 takes carry inputs from the prefix network and therefore needs to wait for the prefix network to finish generate the carry signals before the correct sum can be computed at each level.

Figure 10:
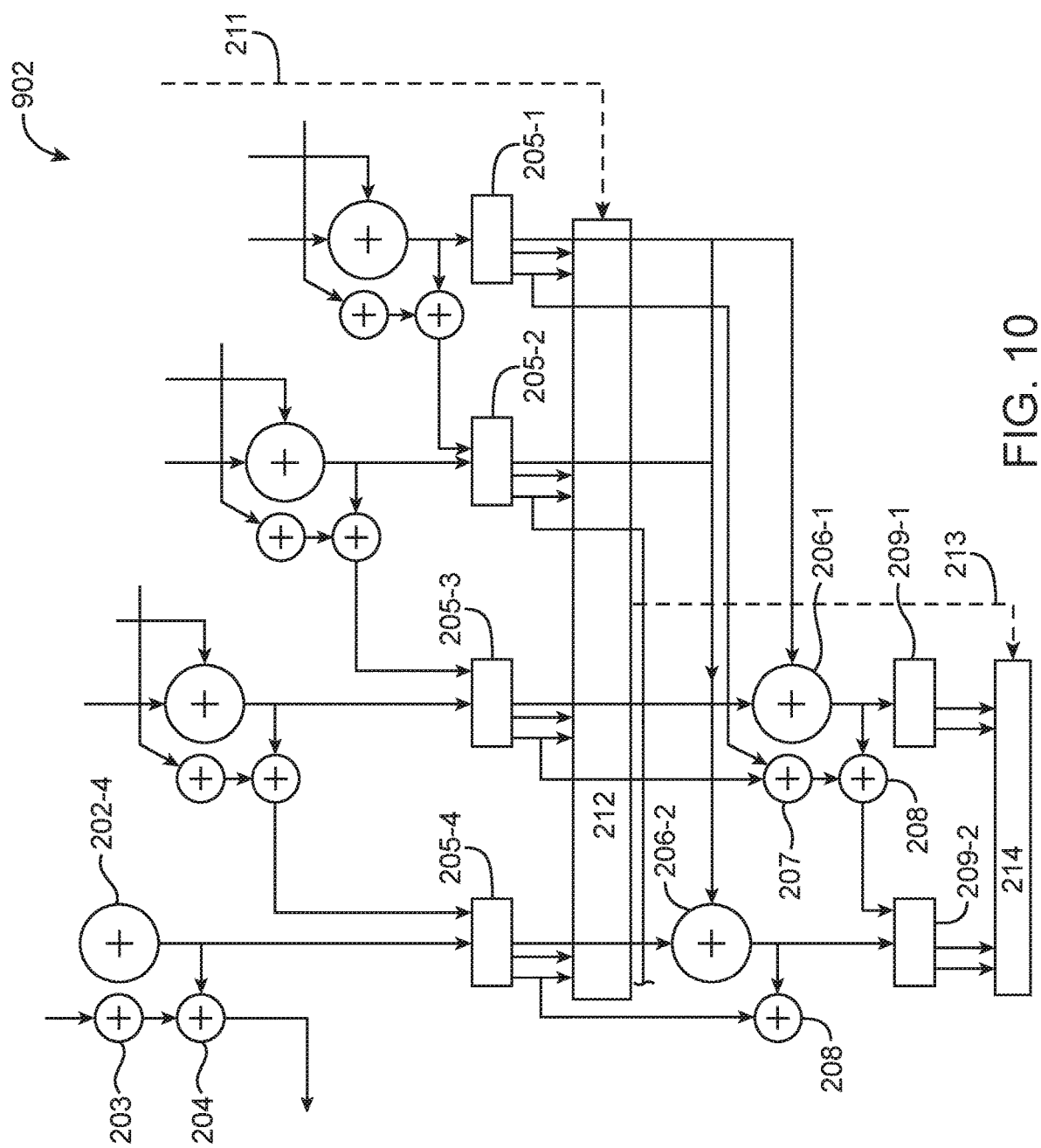
FIG. 10 is a diagram showing the merged adder structure extended to multiple levels in a Karatsuba decomposition in accordance with an embodiment.

FIG. 10 illustrates how the merged/pipelined adder structure can be extended to multiple levels until the number of final segment adders in the lower levels are sufficiently small. As already described above, output sum adders 710 (see, FIGS. 7A and 7B) which receive the delayed input segment adder outputs and adds the carries generated by the prefix tree are needed at each level but are omitted from FIG. 10 to avoid obscuring the present embodiments. As shown in FIG. 9, the pipeline of the prefix tree can be independent from the calculations of the merged adder pipeline. The prefix tree for earlier stages may be more deeply pipelined than the prefix tree in a later stage, which is partially due to the wider distribution of the different auxiliary adders 202, generate bit adders 203, and segment overflow adders 204 in the earlier stages compared to the later stages.

As shown in FIG. 10, the second level may also include auxiliary segment adders 206-1 and 206-2 and associated generate bit and overflow adders 207 and 208. In particular, auxiliary adder 206-1 may be configured to combine the lower half sum bits output directly from decoder 205-1 and the upper half sum bits output directly from decoder 205-3. Note that the operation of auxiliary adders 206 still bypasses prefix network 212 (e.g., auxiliary adders 206 do not have inputs that depend on the carry signals output directly by prefix tree 212), which helps reduce the overall latency. The generate (G) bits associated with this segment are then summed together using a corresponding generate bit adder 207. The carry output values of each adder 207 and adder 206 may be summed together using another segment overflow adder 208. Similarly, auxiliary adder 206-2 may be configured to combine the lower half sum bits output directly from decoder 205-2 and the upper half sum bits output directly from decoder 205-4. The generate (G) bits associated with this segment are then summed together with the carry output of adder 206 using segment overflow adder 208.

The accumulated sum of the overflows output by adder 208 at any point may then be added to the next segment of that same level. For instance, the output of adder 208 associated with auxiliary adder 206-1 may be combined with the sum output of adder 206-2 using segment decoder 209-2. Each segment decoder 209 exhibits the same dual segment adder structure as shown in the example of FIGS. 7A and 7B. Segment decoder 209-1 may just receive the sum output from adder 206-1 without any additional carry overflow input. Decoders 209-1 and 209-2 output G/P bits to corresponding prefix network 214. Prefix network 214 may further receive carry signals from preceding prefix network 212 via path 213. The carry signals fed down through paths 211 and 213 from one prefix tree to the next are used to obtain the correct sums at the end of the overall adder chain.

In addition to reducing the overall latency, the multi-level merged adder pipeline structure of FIGS. 8-10 balances the latencies through the successive adder stages, so that the outputs from all the various adder branches arrive at the leaf multiplier inputs roughly the same pipeline depth (see FIG. 5 wherein partial sums arrive at multipliers 540 via similar pipeline depths at substantially the same time or within two to three clock cycles, within five clock cycles, within 10 clock cycles, within 2-10 clock cycles, within 15 clock cycles, within 20 clock cycles, etc.). This can be accomplished since the various latencies through each adder branch is largely determined or limited by the latency of the topmost prefix network of the decomposition.

Although the methods of operations are described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IC circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is an integrated circuit, comprising: multiplier circuitry configured to receive input operands divided into a plurality of segments, wherein the multiplier circuitry comprises: a first segment decoder circuit configured to output first generate and propagate bits and first sum bits; a second segment decoder circuit configured to output second generate and propagate bits and second sum bits; a prefix network configured to receive the first generate and propagate bits from the first segment decoder circuit and to receive the second generate and propagate bits from the second segment decoder circuit; and an auxiliary adder circuit configured to receive the first sum bits from the first segment decoder circuit and to receive the second sum bits from the second segment decoder circuit, wherein the auxiliary adder circuit is configured to compute corresponding output sum bits without receiving any signals from the prefix network, and wherein the prefix network is configured to operate independently from the auxiliary adder circuit.

Example 2 is the integrated of example 1, wherein the first segment decoder circuit optionally comprises: a first segment adder configured to output the first generate bit and the first sum bits; and a second segment adder configured to receive an asserted carry input signal and to output the first propagate bit.

Example 3 is the integrated circuit of any one of examples 1-2, optionally further comprising: a first additional adder circuit configured to receive the first generate bit from the first segment decoder circuit and the second generate bit from the second segment decoder circuit.

Example 4 is the integrated circuit of example 3, optionally further comprising: a second additional adder circuit configured to receive a signal from the first additional adder circuit and an overflow bit from the auxiliary adder circuit.

Example 5 is the integrated circuit of example 4, optionally further comprising: a third segment decoder circuit configured to receive the output sum bits from the auxiliary adder circuit; and a fourth segment decoder circuit configured to receive an output signal from the second additional adder circuit.

Example 6 is the integrated circuit of example 5, optionally further comprising: an additional prefix network configured to receive generate and propagate bits from the third segment decoder circuit and the fourth segment decoder circuit.

Example 7 is the integrated circuit of example 6, wherein the additional prefix network is optionally further configured to receive a carry signal directly from the prefix network via a prefix carry signal path.

Example 8 is the integrated circuit of any one of examples 6-7, optionally further comprising: a final adder circuit configured to receive sum bits from the third segment decoder circuit and a carry signal from the additional prefix network.

Example 9 is an integrated circuit, comprising: multiplier circuitry that comprises: a first prefix network; a second prefix network configured to receive carry signals from the first prefix network via a prefix carry signal path; and a decoder circuit configured to output generate and propagate bits to the second prefix network without using any signals from the first prefix network.

Example 10 is the integrated circuit of example 9, wherein the decoder circuit optionally comprises: a first segment adder configured to output the generate bit and sum bits; and a second segment adder configured to receive an asserted carry input signal and to output the propagate bit.

Example 11 is the integrated circuit of any one of examples 9-10, wherein the second prefix network is optionally smaller than the first prefix network.

Example 12 is the integrated circuit of any one of examples 9-11, optionally further comprising: a first additional decoder circuit configured to output first generate and propagate bits to the first prefix network; and a second additional decoder circuit configured to output second generate and propagate bits to the first prefix network.

Example 13 is the integrated circuit of example 12, wherein the first additional decoder circuit is optionally further configured to output first sum bits, and wherein the second additional decoder circuit is optionally further configured to output second sum bits.

Example 14 is the integrated circuit of example 13, optionally further comprising: a generate bit adder configured to combine the first generate bit from the first additional decoder circuit and the second generate bit from the second additional decoder circuit.

Example 15 is the integrated circuit of example 14, optionally further comprising: an auxiliary adder configured to combine the first sum bits from the first additional decoder circuit and the second sum bits from the second additional decoder circuit, wherein the auxiliary adder is further configured to operate independently from the first and second prefix networks.

Example 16 is the integrated circuit of example 15, optionally further comprising: an overflow adder configured to combine bits output from the generate bit adder and a carry out bit output from the auxiliary adder.

Example 17 is the integrated circuit of example 16, optionally further comprising: a third additional decoder circuit configured to output generate and propagate bits to the second prefix network using signals output from the overflow adder.

Example 18 is the integrated circuit of any one of examples 9-17, wherein the multiplier circuitry optionally further comprises additional prefix networks coupled to the first and second prefix networks.

Example 19 is an integrated circuit, comprising: multiplier circuitry decomposed into a plurality of adder stages, wherein the multiplier circuitry comprises a plurality of multiplier circuits configured to receive sum signals via a tree of paths, and wherein the latencies of the sum signals traversing the tree of paths are balanced so that the sum signals arrive simultaneously or within a few clock cycles at the plurality of multiplier circuits.

Example 20 is the integrated circuit of example 19, wherein the multiplier circuitry is optionally decomposed using a Karatsuba multiplier decomposition scheme.

Example 21 is the integrated circuit of any one of examples 19-20, wherein the latency of each of the sum signals is optionally determined by a prefix network in a topmost adder stage in the plurality of adder stages.

Example 22 is the integrated circuit of any one of examples 19-21, wherein the multiplier circuitry is optionally decomposed into more than two adder stages each of which includes a separate prefix network circuit.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
    multiplier circuitry configured to receive input operands divided into a plurality of segments, wherein the multiplier circuitry comprises:
    a first segment decoder circuit configured to output first generate and propagate bits and first sum bits;
    a second segment decoder circuit configured to output second generate and propagate bits and second sum bits;
    a prefix network configured to receive the first generate and propagate bits from the first segment decoder circuit and to receive the second generate and propagate bits from the second segment decoder circuit; and
    an auxiliary adder circuit configured to receive the first sum bits from the first segment decoder circuit and to receive the second sum bits from the second segment decoder circuit, wherein the auxiliary adder circuit is configured to compute corresponding output sum bits without receiving any signals from the prefix network, and wherein the prefix network is configured to operate independently from the auxiliary adder circuit.

2. The integrated circuit of claim 1, wherein the first segment decoder circuit comprises:
    a first segment adder configured to output the first generate bit and the first sum bits; and
    a second segment adder configured to receive an asserted carry input signal and to output the first propagate bit.

3. The integrated circuit of claim 1, further comprising:
    a first additional adder circuit configured to receive the first generate bit from the first segment decoder circuit and the second generate bit from the second segment decoder circuit.

4. The integrated circuit of claim 3, further comprising:
    a second additional adder circuit configured to receive a signal from the first additional adder circuit and an overflow bit from the auxiliary adder circuit.

5. The integrated circuit of claim 4, further comprising:
    a third segment decoder circuit configured to receive the output sum bits from the auxiliary adder circuit; and
    a fourth segment decoder circuit configured to receive an output signal from the second additional adder circuit.

6. The integrated circuit of claim 5, further comprising:
    an additional prefix network configured to receive generate and propagate bits from the third segment decoder circuit and the fourth segment decoder circuit.

7. The integrated circuit of claim 6, wherein the additional prefix network is further configured to receive a carry signal directly from the prefix network via a prefix carry signal path.

8. The integrated circuit of claim 6, further comprising:
    a final adder circuit configured to receive sum bits from the third segment decoder circuit and a carry signal from the additional prefix network.

9. An integrated circuit, comprising:
    multiplier circuitry that comprises:
    a first prefix network;
    a second prefix network configured to receive carry signals from the first prefix network via a prefix carry signal path; and
    a decoder circuit configured to output generate and propagate bits to the second prefix network without using any signals from the first prefix network.

10. The integrated circuit of claim 9, wherein the decoder circuit comprises:
    a first segment adder configured to output the generate bit and sum bits; and
    a second segment adder configured to receive an asserted carry input signal and to output the propagate bit.

11. The integrated circuit of claim 9, wherein the second prefix network is smaller than the first prefix network.

12. The integrated circuit of claim 9, further comprising:
    a first additional decoder circuit configured to output first generate and propagate bits to the first prefix network; and
    a second additional decoder circuit configured to output second generate and propagate bits to the first prefix network.

13. The integrated circuit of claim 12, wherein the first additional decoder circuit is further configured to output first sum bits, and wherein the second additional decoder circuit is further configured to output second sum bits.

14. The integrated circuit of claim 13, further comprising:
a generate bit adder configured to combine the first generate bit from the first additional decoder circuit and the second generate bit from the second additional decoder circuit.

15. The integrated circuit of claim 14, further comprising:
an auxiliary adder configured to combine the first sum bits from the first additional decoder circuit and the second sum bits from the second additional decoder circuit, wherein the auxiliary adder is further configured to operate independently from the first and second prefix networks.

16. The integrated circuit of claim 15, further comprising:
an overflow adder configured to combine bits output from the generate bit adder and a carry out bit output from the auxiliary adder.

17. The integrated circuit of claim 16, further comprising:
a third additional decoder circuit configured to output generate and propagate bits to the second prefix network using signals output from the overflow adder.

18. The integrated circuit of claim 9, wherein the multiplier circuitry further comprises additional prefix networks coupled to the first and second prefix networks.

19. An integrated circuit, comprising:
multiplier circuitry decomposed into two or more adder stages, wherein the multiplier circuitry comprises a plurality of multiplier circuits configured to receive sum signals via a tree of paths, wherein the multiplier circuitry is decomposed into two or more adder stages, and wherein the latencies of the sum signals traversing the tree of paths are balanced so that the sum signals arrive simultaneously or within a few clock cycles at the plurality of multiplier circuits.

20. The integrated circuit of claim 19, wherein the multiplier circuitry is decomposed using a Karatsuba multiplier decomposition scheme.

21. The integrated circuit of claim 19, wherein the latency of each of the sum signals is primarily determined by a prefix network in a topmost adder stage in the plurality of adder stages.

22. The integrated circuit of claim 19, wherein the two or more adder stages each of which includes a separate prefix network circuit.

* * * * *